United States Patent
Aschke et al.

(10) Patent No.: US 8,639,071 B2
(45) Date of Patent: Jan. 28, 2014

(54) DEVICE FOR FORMING LASER RADIATION

(75) Inventors: Lutz Aschke, Wetter (DE); Andreas Bayer, Unna (DE); Udo Fornahl, Münster (DE); Jens Meinschien, Dortmund (DE); Thomas Mitra, Düsseldorf (DE)

(73) Assignee: LIMO PatentverwaltungGmbH & Co. KG, Dortmund (DE)

( * ) Notice: Subject to any disclaimer, the term of this patent is extended or adjusted under 35 U.S.C. 154(b) by 498 days.

(21) Appl. No.: 12/896,150

(22) Filed: Oct. 1, 2010

(65) Prior Publication Data

US 2011/0110626 A1  May 12, 2011

(30) Foreign Application Priority Data

Oct. 1, 2009  (DE) .................. 10 2009 047 989

(51) Int. Cl.
G02B 6/32 (2006.01)
G02B 6/26 (2006.01)
G02B 6/42 (2006.01)

(52) U.S. Cl.
USPC ............... 385/33; 385/27; 385/31; 385/39

(58) Field of Classification Search
USPC .......................................... 385/33
See application file for complete search history.

(56) References Cited

U.S. PATENT DOCUMENTS

| | | |
|---|---|---|
| 5,973,853 A | 10/1999 | Gaebe et al. |
| 6,212,011 B1 | 4/2001 | Lissotschenko et al. |
| 6,407,870 B1 | 6/2002 | Hurevich et al. |
| 6,471,372 B1 | 10/2002 | Lissotschenko et al. |
| 6,700,709 B1 | 3/2004 | Fermann |
| 7,068,438 B2 * | 6/2006 | Hansson et al. ............. 359/652 |
| 2004/0240489 A1 | 12/2004 | Teramura et al. |
| 2007/0086501 A1 | 4/2007 | Karlsen |

FOREIGN PATENT DOCUMENTS

| | | |
|---|---|---|
| DE | 19635942 A1 | 3/1998 |
| EP | 1 006 382 B1 | 6/2000 |
| WO | 03098283 A1 | 11/2003 |

* cited by examiner

*Primary Examiner* — Uyen Chau N Le
*Assistant Examiner* — Kajli Prince
(74) *Attorney, Agent, or Firm* — Laurence A. Greenberg; Werner H. Stemer; Ralph E. Locher

(57) ABSTRACT

An apparatus for forming laser radiation. The apparatus can form the laser radiation such that the laser radiation can enter an optical fiber. The apparatus contains a first lens device for deflection and/or imaging or collimation of the laser radiation with respect to a first direction, and a second lens device for deflection and/or imaging or collimation of the laser radiation with respect to a second direction. The first and the second lens devices are provided in or on a component.

12 Claims, 2 Drawing Sheets

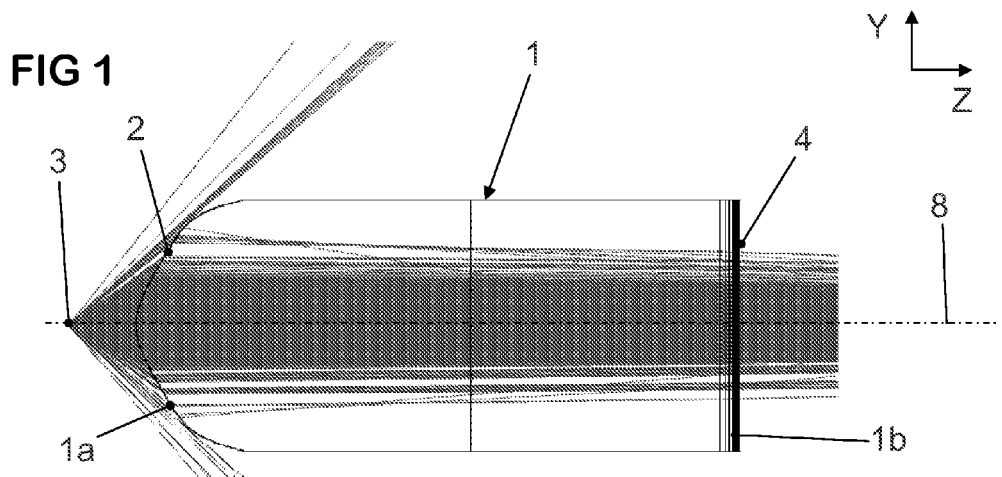
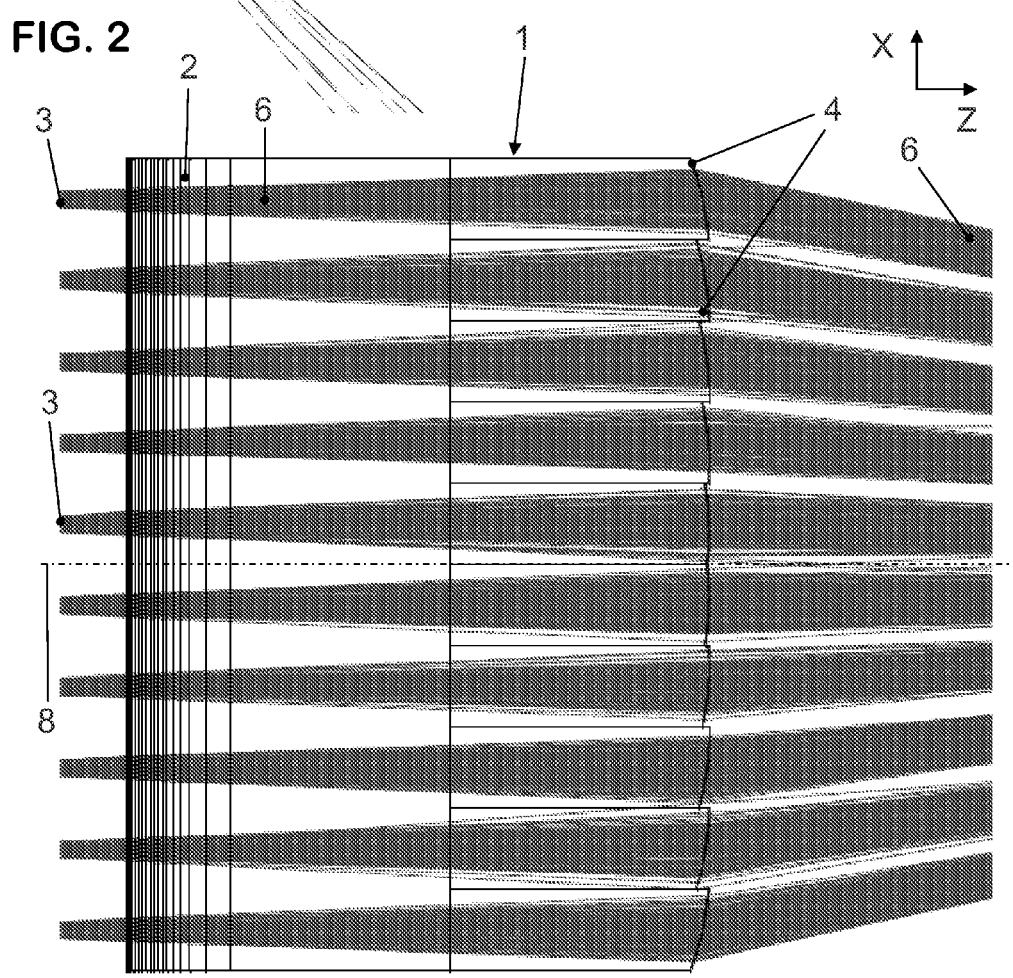

DEVICE FOR FORMING LASER RADIATION

BACKGROUND OF THE INVENTION

Field of the Invention

The present invention relates to an apparatus for forming laser radiation. The apparatus has a first lens device for deflection, imaging and/or collimation of the laser radiation with respect to a first direction, and a second lens device for deflection, imaging and/or collimation of the laser radiation with respect to a second direction.

DEFINITIONS

In the propagation direction of the laser radiation means the mean propagation direction of the laser radiation, particularly when this is not a planar wave or is at least partially divergent. Unless expressly stated to the contrary, a laser beam, light beam, partial beam or beam does not mean an idealized beam of the geometric optics, but a real light beam, such as a laser beam with a Gaussian profile or a top-hat profile, which does not have an infinitesimally small beam cross section, but an extended beam cross section. Light is intended to refer not only to the visible spectral range but also to the infrared and ultraviolet spectral ranges.

An apparatus of the type mentioned initially is known, for example, from EP 1 006 382 B1, where the laser beams originating from a laser diode bar are focused by a combination of a plurality of microoptics and macrooptics onto the inlet area of an optical fiber. These methods require a plurality of components and adjustment steps for injection of the laser diode bar into a fiber, and therefore a high cost and time factor with respect to the production of a fiber-coupled laser diode module.

U.S. Pat. No. 6,407,870 B1 discloses a monolithic component which, on an inlet area, has an array of lenses which are offset vertically and horizontally with respect to one another for the collimation of the fast axis and, on an outlet area, has an array of lenses which are offset vertically and horizontally with respect to one another, for the collimation of the slow axis. In this apparatus as well, means for focusing the individual laser beams must be arranged on an inlet area of an optical fiber, behind the component, in the propagation direction of the laser radiation. Furthermore, means for vertical offsetting of the individual laser beams must be provided in front of the component, in order that the individual laser beams of a laser diode bar can strike the cylindrical lenses, which are arranged vertically offset.

BRIEF SUMMARY OF THE INVENTION

The problem on which the present invention is based is to provide an apparatus of the type mentioned initially which is designed to be simpler and/or more cost effective and/or more effective.

According to the invention, this is achieved by an apparatus for forming laser radiation, wherein the apparatus can form the laser radiation such that the laser radiation can enter an optical fiber. The apparatus includes a component, a first lens device for deflection, imaging and/or collimation of the laser radiation with respect to a first direction, and a second lens device for deflection, imaging and/or collimation of the laser radiation with respect to a second direction. The first and second lens devices are disposed in or on the component.

Accordingly, the first and the second lens means are provided in or on a component. The fiber injection can therefore in some circumstances be achieved by a single component, thus making it possible to reduce the costs for a corresponding apparatus.

In this case, a configuration is particularly advantageous in which both the first and the second lens means can image the laser radiation on the inlet area of an optical fiber. It may also be advantageous to provide an array of cylindrical lenses with respect to the slow axis direction of the laser beams which originate from a laser diode bar, by means of which at least some of the laser beams can be deflected onto the inlet area of the optical fiber.

Further features and advantages of the present invention will become clear with reference to the following description of preferred exemplary embodiments and with reference to the attached figures, in which:

BRIEF DESCRIPTION OF THE SEVERAL VIEWS OF THE DRAWING

FIG. 1 shows a side view of an apparatus according to the invention, with laser radiation formed by the apparatus;

FIG. 2 shows a plan view of the apparatus with laser radiation formed by the apparatus, as shown in FIG. 1;

DESCRIPTION OF THE INVENTION

Figure 3:
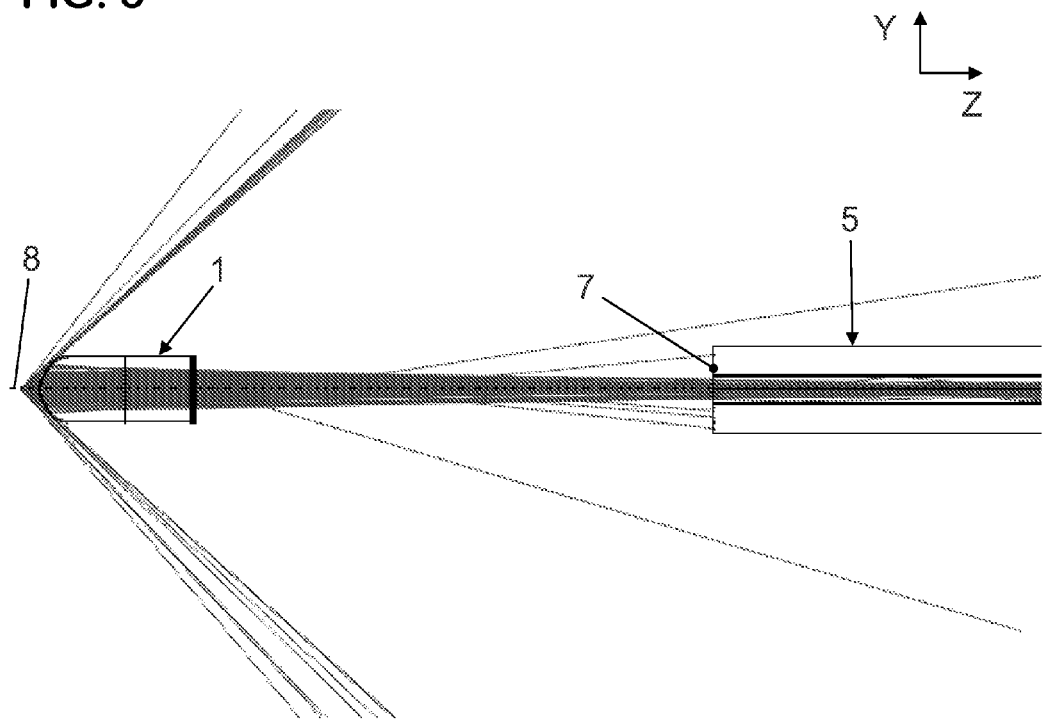
FIG. 3 shows a side view of an apparatus according to the invention, with an adjacent optical fiber and laser radiation formed by the apparatus.

Cartesian coordinate systems have been introduced in the figures, in order to allow better orientation.

The object of the invention is to reduce the beamforming to a minimum number of components (integral, monolithic microoptics) and adjustment steps, and therefore cost-effective production of a fiber-coupled laser diode module. This beamforming is achieved by a single, monolithic and microoptical component 1 (see FIGS. 1 and 2) which has a first cylindrical lens 2 on a first area 1a, which is used as an inlet area, and an array of second cylindrical lenses 4, tilted through 90° with respect to the former, on a second area 1b which is used as an outlet area.

The laser beams 6 which originate from the emitters 3 of a laser diode bar are imaged directly on the inlet area 7 of the optical fiber 5 by the first cylindrical lens 2 in the fast axis direction or the Y direction. The second cylindrical lenses 4 image each individual laser beam 6 on the inlet area 7 of the optical fiber 5 (see FIGS. 3 and 4) in the slow axis direction or the X direction, off-center in the illustrated exemplary embodiment.

Figure 4:
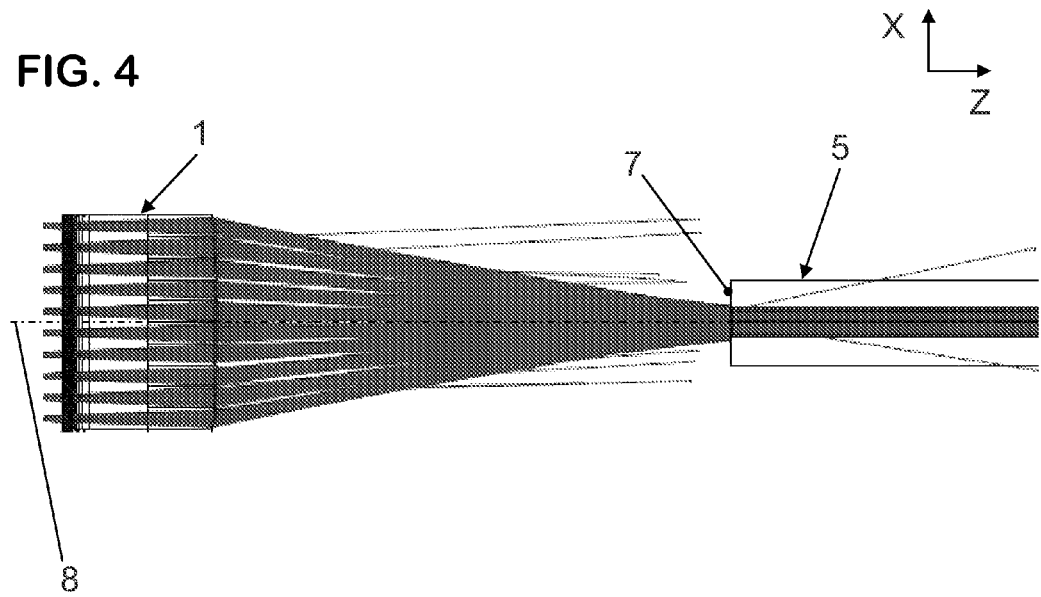
FIG. 4 shows a plan view of the apparatus with an adjacent optical fiber and laser radiation formed by the apparatus, as shown in FIG. 3.

In this case, in particular, the outer cylindrical lenses 4 in the X direction, or the upper and lower second cylindrical lenses 4 in FIG. 2, are asymmetric such that those laser beams 6 which are not in the center are deflected toward the center or toward the optical axis 8 of the component 1 (see FIG. 2 and FIG. 4). In contrast, the second cylindrical lenses 4, which are arranged in the center of the array and adjacent to the optical axis 8, are symmetrical or only very slightly asymmetric. The symmetry of the second cylindrical lenses 4 decreases outward from the center, or upward and downward in FIG. 2. In particular, the optical axis 8 of the component 1 may correspond to the optical axis of the optical fiber, or may be coaxial with respect to it.

FIG. 1 and FIG. 2 show the beamforming principle well. The exemplary embodiment makes it possible to injection a minibar (10 emitters, 100/500th structure) directly and without further macrooptics into a 600 μm fiber for which NA=0.22. This results in a theoretical coupling efficiency (purely geometric optical losses without reflection losses) of about 95%. A coupling efficiency of 90%±3% was measured.

Alternatively, it is possible to arrange the first cylindrical lens 2 on the second area 1b and the array of second cylindrical lenses 4 on the first area 1a. It is also possible to form both the first cylindrical lens 2 and the array of second cylindrical lenses 4 either on the first area 1a or on the second area 1b.

Furthermore, it is possible for the first cylindrical lens 2 not to image the laser beams 6 with respect to the fast axis, but to collimate them. It is also possible for the second cylindrical lenses 4 not to image laser beams 6 with respect to the slow axis, but to collimate them and in the process to deflect the laser beams in the direction of the inlet area 7 of the optical fiber 5.

When the intention is to inject the laser radiation of a stack of laser diode bars into an optical fiber 5, a plurality of first cylindrical lenses 2 can be provided, arranged one above the other in the Y direction. These first cylindrical lenses 2 are in this case tilted with respect to one another such that the laser beams originating from different laser diode bars are deflected toward the center or toward the optical axis 8 with respect to the fast axis of the Y direction (the position of the optical axis in the Y direction is shown schematically in FIG. 1).

Alternatively, it is invariably possible to provide beam-forming based on the principle of collimation of the fast axis and the slow axis with one component 1 and subsequent focusing by means of low-cost, spherical optics.

It is possible that the apparatus can form the laser radiation such that the laser radiation can be injected into more than one optical fiber 5, for example into two adjacent optical fibers 5. This makes it possible to choose a greater number of emitters 3 which emit laser radiation.

The invention claimed is:

1. An apparatus for forming laser radiation, wherein the apparatus can form the laser radiation such that the laser radiation can enter an optical fiber, the apparatus comprising:
   a component;
   a first lens device for at least one of deflection, imaging or collimation of the laser radiation with respect to a first direction, said first lens device imaging the laser radiation on an inlet area of the optical fiber; and
   a second lens device for at least one of deflection, imaging or collimation of the laser radiation with respect to a second direction, said second lens device imaging the laser radiation on the inlet area of the optical fiber, said first and second lens devices being disposed in or on said component;
   wherein the apparatus can be used to form laser beams which originate from a laser diode bar or a stack of laser diode bars, wherein the first direction corresponds to a fast axis, and the second direction corresponds to a slow axis;
   wherein said first lens device as at least one first cylindrical lens; and
   wherein said second lens device is an array of second cylindrical lenses.

2. The apparatus according to claim 1, wherein said component is a monolithic component.

3. The apparatus according to claim 1, wherein:
   said component has a first area and a second area;
   said first lens device is formed by refractive structures in said first area of said component, said first area can be used as an inlet area for the laser radiation.

4. The apparatus according to claim 3, wherein said second lens device is formed from refractive structures in said second area of said component, said second area is opposite said first area and can be used as an outlet area for the laser radiation.

5. The apparatus according to claim 1, wherein said at least one first cylindrical lens is aligned at right angles to said second cylindrical lenses.

6. The apparatus according to claim 1, wherein at least some of said second cylindrical lenses in said array of second cylindrical lenses are asymmetric, and therefore at least some of the laser beams of the laser diode bar or of the stack of laser diode bars, including outer laser beams, can be deflected to a greater extent than inner laser beams, with respect to the second direction.

7. The apparatus according to claim 1, wherein said at least one first cylindrical lens is configured such that it can image the laser beams of the laser diode bar or of the stack of laser diode bars on an inlet area of an optical fiber with respect to the first direction.

8. The apparatus according to claim 1, wherein at least some of said second cylindrical lenses in said array of second cylindrical lenses are configured such that they can image the laser beams of the laser diode bar or of the stack of laser diode bars on an inlet area of the optical fiber with respect to the second direction.

9. The apparatus according to claim 1, wherein said first lens device has a plurality of first cylindrical lenses disposed alongside one another in the first direction, wherein different ones of said first cylindrical lenses can deflect the laser beams from different laser diode bars in the stack of laser diode bars differently with respect to the first direction.

10. The apparatus according to claim 1, wherein said component has a first area and a second area, said first and second lens devices are disposed both on said first area and on said second area of said component.

11. The apparatus according to claim 1, wherein said component has a first area and a second area, said first and second lens devices are disposed either on said first area or on said second area of said component.

12. The apparatus according to claim 1, wherein the apparatus can form the laser radiation such that the laser radiation can enter more than one optical fiber.

* * * * *